United States Patent
Bailey et al.

(10) Patent No.: US 10,210,292 B2
(45) Date of Patent: *Feb. 19, 2019

(54) PROCESS-METROLOGY REPRODUCIBILITY BANDS FOR LITHOGRAPHIC PHOTOMASKS

(71) Applicant: International Business Machines Corporation, Armonk, NY (US)

(72) Inventors: Todd C. Bailey, Poughkeepsie, NY (US); Ioana C. Graur, Poughkeepsie, NY (US); Scott D. Halle, Slingerlands, NY (US); Marshal A. Miller, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/838,423

(22) Filed: Dec. 12, 2017

(65) Prior Publication Data

US 2018/0101630 A1 Apr. 12, 2018

Related U.S. Application Data

(63) Continuation of application No. 14/669,924, filed on Mar. 26, 2015, now Pat. No. 9,928,316.

(51) Int. Cl.
*G06F 17/50* (2006.01)
*G03F 7/20* (2006.01)

(52) U.S. Cl.
CPC ...... *G06F 17/5009* (2013.01); *G03F 7/70616* (2013.01); *G03F 7/70625* (2013.01); *G06F 17/5081* (2013.01)

(58) Field of Classification Search
USPC .......................................................... 716/54
See application file for complete search history.

(56) References Cited

U.S. PATENT DOCUMENTS

| | | | |
|---|---|---|---|
| 7,488,933 B2 | 2/2009 | Ye et al. | |
| 8,279,409 B1 | 10/2012 | Sezginer et al. | |
| 8,532,964 B2 | 9/2013 | Wei | |
| 8,812,145 B2 | 8/2014 | Fan et al. | |
| 8,832,609 B2 | 9/2014 | Robles et al. | |
| 8,873,830 B2 | 10/2014 | Yamanaka | |
| 8,887,105 B1 | 11/2014 | Bruguier et al. | |
| 9,256,709 B2 | 2/2016 | Yu et al. | |
| 9,292,643 B2 | 3/2016 | Sahouria et al. | |
| 9,671,685 B2 | 6/2017 | Lin et al. | |
| 2014/0123084 A1 | 5/2014 | Tang et al. | |
| 2014/0224986 A1* | 8/2014 | Shibahara | G01B 15/04 250/307 |

(Continued)

OTHER PUBLICATIONS

"Optical proximity correction—Wikipedia". Jan. 3, 2015. <,https://en.wikipedia.org/w/index.php?title=Optical_proximity_correction&oldid=640818360>.

(Continued)

*Primary Examiner* — Eric Lee
(74) *Attorney, Agent, or Firm* — Stephen R. Yoder (57) ABSTRACT

A photomask lithography simulation model is created for making a semiconductor chip. Poor metrology is filtered and removed from a contour-specific metrology dataset to improve performance of the photomask. Filtering is performed by the application of a weighting scheme.

15 Claims, 7 Drawing Sheets (56) References Cited

U.S. PATENT DOCUMENTS

2014/0351773 A1 11/2014 Cao et al.
2016/0283617 A1 9/2016 Bailey et al.

OTHER PUBLICATIONS

Mack, "Using the Normalized Image Log-Slope" The Lithography Expert (Winter 2001). Six pages.
Appendix P List of IBM Patents or Applications Treated as Related. Dated Dec. 5, 2017. Two pages.

\* cited by examiner

PROCESS-METROLOGY REPRODUCIBILITY BANDS FOR LITHOGRAPHIC PHOTOMASKS

BACKGROUND

The present invention relates generally to the field of photolithography, and more particularly to micro-fabrication processes.

Electronic circuit simulation uses mathematical models to replicate the behavior of an actual electronic device or circuit. For integrated circuit (IC) design, electronic design automation (EDA) tools are often used. Simulation software allows for modeling of circuit operation and is an invaluable analysis tool. Simulating a circuit's behavior before actually building it improves design efficiency by revealing faulty designs and providing insight into the behavior of electronic circuit designs. In particular, for integrated circuits, the tooling (photomask) is expensive, breadboards are impractical, and probing the behavior of internal signals is difficult. Therefore, almost all IC design activities rely on circuit simulation.

Photolithography, also known as optical lithography, or UV lithography, is a process used in micro-fabrication to pattern parts of a thin film, or the bulk of a substrate. It uses light to transfer a geometric pattern from a photomask to a light-sensitive chemical "photoresist" on the substrate.

Mask data preparation (MDP) is the procedure of translating a file containing the intended set of polygons from an integrated circuit layout into set of instructions that a photomask writer can use to generate a physical mask. MDP usually involves mask fracturing where complex polygons are translated into simpler shapes, often rectangles and trapezoids, that can be handled by the mask writing hardware. Recent MDP procedures require the additional steps of resolution enhancement technologies (RET) and/or optical proximity correction (OPC) with a focus on design for manufacturability.

Optical proximity correction (OPC) is a photolithography enhancement technique commonly used to compensate for image errors due to diffraction, or process effects. The need for OPC often arises in the making of semiconductor devices due to the limitations of light to maintain the edge placement integrity of the original design, after processing, into the etched image on the silicon wafer.

OPC and verification model accuracy depend on having a large number of data points for calibration. The requirement of a large number of data points drives up process costs, but the results are precise. For example, OPC models use optics (physical) and empirical resist models to balance the accuracy and speed of processing, which leads to a high dependency on the amount of data collected, the relevance of the data to all design constructs that are going to be placed on the mask, the precision of metrology, and the SEM (scanning electron microscopy) offsets to physical data. Conventional manufacturability efforts, such as OPC are confronted with the negative effects associated with the enormous amounts of data they can produce (too much data can sometimes become a problem for the mask writer to be able to create a mask in a reasonable amount of time).

Contour tracing, also known as border following or boundary following, is a technique that is applied to digital images in order to extract their boundary (referred to herein as "contour extraction." Once the contour of a given pattern is extracted, its characteristics may be examined and used as features for use in pattern classification. It is known to extract and encode the boundary points of contours.

SUMMARY

In one aspect of the present invention, a method, a computer program product, and a system for creating a lithography simulation model includes: (i) determining an average contour based on a filtered subset of a plurality of scanning electron microscopy (SEM) metrology datasets corresponding to a target contour; (ii) computing an image parameter for a set of gauges for the target contour; (iii) correlating the image parameter and a process-metrology reproducibility (PMR) band to generate a parameter to PMR band correlation; (v) determining a sampling count for the target contour based at least in part on the parameter to PMR band correlation; (vi) computing an image log-scope (ILS) value for each gauge in the set of gauges; (vii) generating a weight function for the target contour based at least in part on a PMR variance and the ILS value; (viii) creating a lithography simulation model based on the weight function; and (ix) calibrating a photoresist compact model according to the lithography simulation model. The filtered subset excludes unphysical excursions of the target contour.

DETAILED DESCRIPTION

A photomask model is created for making a semiconductor chip. Poor metrology is filtered and removed from a contour-specific metrology dataset to improve performance of the photomask. Filtering is performed by the application of a weighting scheme. The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium, or to an external computer or external storage device via a network, for example, the Internet, a local area network, a wide area network, and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network, and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions, or acts, or carry out combinations of special purpose hardware and computer instructions.

Figure 1:
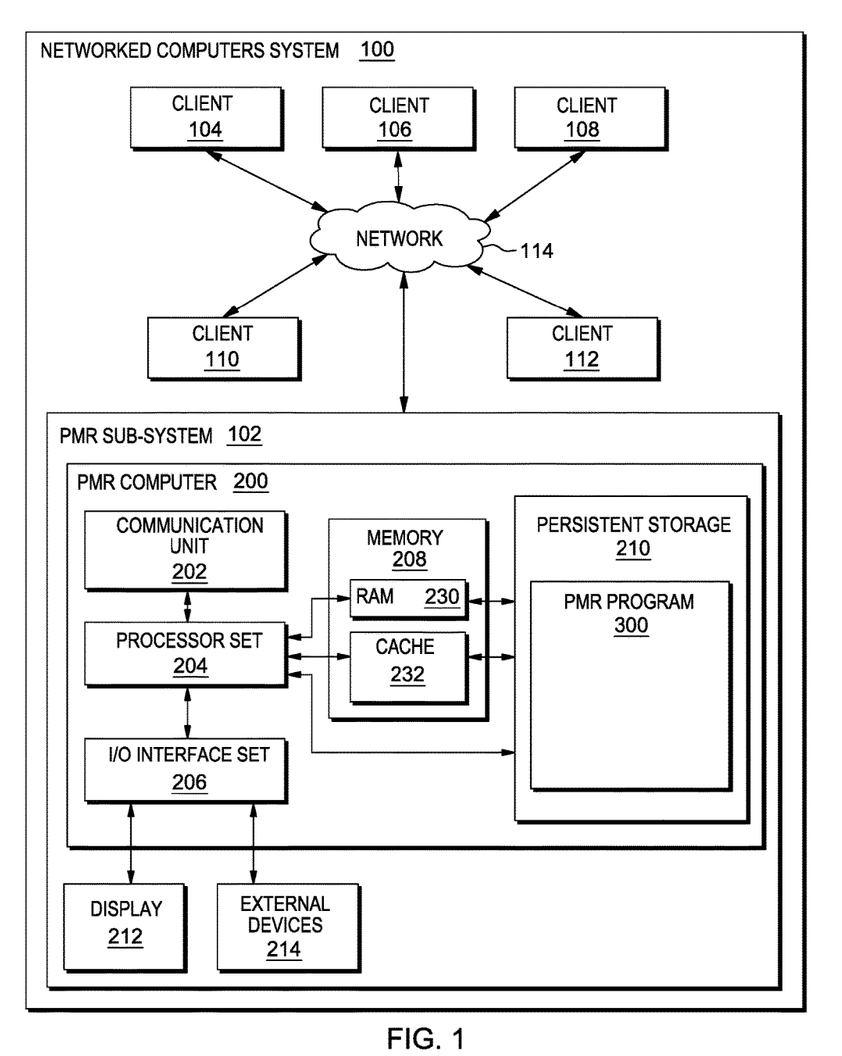
FIG. 1 is a schematic view of a first embodiment of a system according to the present invention.

The present invention will now be described in detail with reference to the Figures. FIG. 1 is a functional block diagram illustrating various portions of networked computers system 100, in accordance with one embodiment of the present invention, including: process-metrology reproducibility (PMR) band sub-system 102; client sub-systems 104, 106, 108, 110, 112; communication network 114; PMR band computer 200; communication unit 202; processor set 204; input/output (I/O) interface set 206; memory device 208; persistent storage device 210; display device 212; external device set 214; random access memory (RAM) devices 230; cache memory device 232; and PMR band program 300.

Sub-system 102 is, in many respects, representative of the various computer sub-system(s) in the present invention. Accordingly, several portions of sub-system 102 will now be discussed in the following paragraphs.

Sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Program 300 is a collection of machine readable instructions and/or data that is used to create, manage, and control certain software functions that will be discussed in detail below.

Sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

Sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware component within a system. For example, the communications fabric can be implemented, at least in part, with one or more buses.

Memory 208 and persistent storage 210 are computer readable storage media. In general, memory 208 can include any suitable volatile or non-volatile computer readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions, and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either, or both, physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with computer 200. For example, I/O interface set 206 provides a connection to external device set 214. External device set 214 will typically include devices such as a keyboard, keypad, a touch screen, and/or some other suitable input device. External device set 214 can also include portable computer readable storage media such as, for example, thumb drives, portable optical or magnetic disks, and memory cards. Software and data used to practice embodiments of the present invention, for example, program 300, can be stored on such portable computer readable storage media. In these embodiments, the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the present invention. However, it should be appreciated that any particular program nomenclature herein is used merely for convenience, and thus the present invention should not be limited to use solely in any specific application identified and/or implied by such nomenclature.

Figure 3:
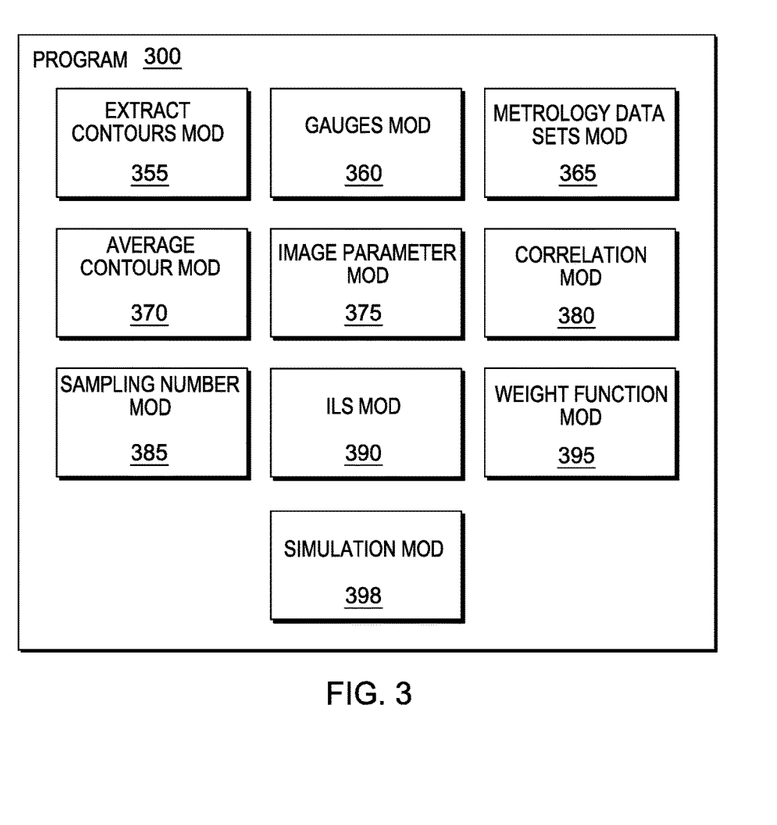
FIG. 3 is a schematic view of a machine logic (for example, software) portion of the first embodiment system.

PMR band program 300 operates to support a modeler in creating a photomask lithography simulation model for making a semiconductor chip. In some embodiments, poor metrology is filtered and removed from a contour-specific metrology dataset. Filtering is performed by the application of a weighting scheme.

Some embodiments of the present invention recognize the following facts, potential problems and/or potential areas for improvement with respect to the current state of the art: (i) collecting large amounts of data is expensive; (ii) the weighting of one-dimensional constructs (1D) is discrepantly higher than two-dimensional constructs (2D) due to the lack of confidence in the 2D measurements; and/or (iii) no method is available to automatically sort out bad data points before they are sent to the modeler, which leads to much time and effort spent separating good and bad data points.

Figure 2:
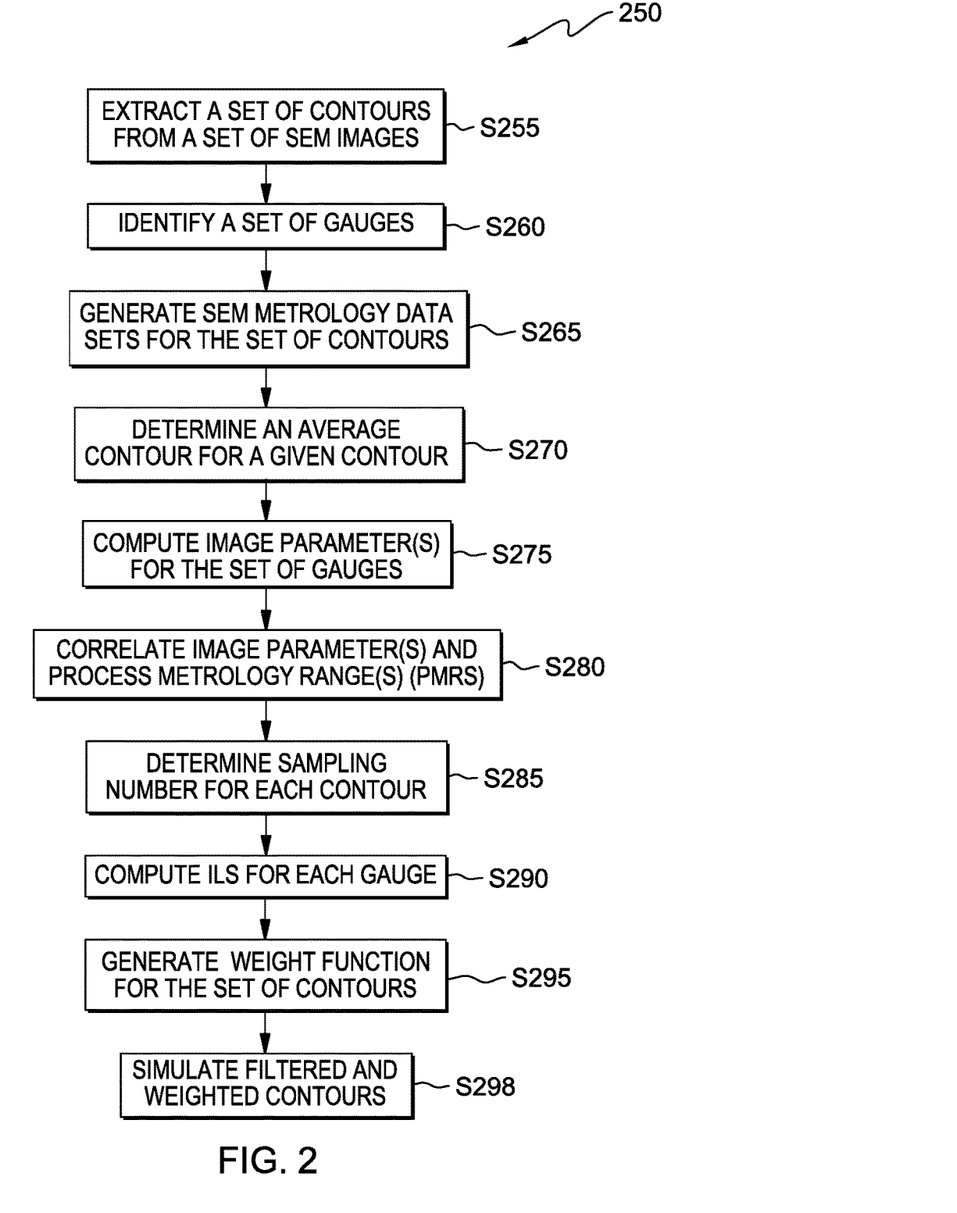
FIG. 2 is a flowchart showing a method performed, at least in part, by the first embodiment system.

FIG. 2 shows flowchart 250 depicting a first method, according to the present invention. FIG. 3 shows program 300 for performing at least some of the method steps of flowchart 250. This method and associated software will now be discussed, over the course of the following paragraphs, with extensive reference to FIG. 2 (for the method step blocks) and FIG. 3 (for the software blocks).

Processing begins at step S255, where extract contours module "mod" 355, extracts a set of contours from a set of SEM (scanning electron microscopy) images on a photomask. Extracting contours from a set of SEM images is performed by one of any number of conventional programs, such as DesignGauge Analyzer. (Note: the term(s) "DesignGauge" and "DesignGauge Analyzer" may be subject to trademark rights in various jurisdictions throughout the world and are used here only in reference to the products or services properly denominated by the marks to the extent that such trademark rights may exist.)

Processing proceeds to step S260, where gauges mod 360 identifies a set of gauges. Identification of the gauges is based on fragmentation through the use of a relatively simple model, such as a constant threshold model, where more sampling points are placed in areas of high frequency, such as line ends and inside corners, and fewer, or sparse, sampling points are placed in areas of low frequency, such as parallel lines.

Processing proceeds to step S265, where metrology datasets mod 365 generates SME metrology datasets for the set of contours extracted in step S255. The metrology datasets include measurements of key dimensions associated with the set of gauges. The individual metrology results are stored as metrology datasets.

Processing proceeds to step S270, where average contour mod 370 determines an average metrology range associated with a given contour to define an average contour.

Processing proceeds to step S275, where image parameter mod 375 computes the image parameter value(s) for the set of gauges.

Processing proceeds to step S280, where correlation mod 380 correlates image parameter value(s) and process-metrology reproducibility (PMR) band(s). By correlating the computed image parameter values, such as 1/ILS and image contrast, with corresponding filtered contour process-metrology reproducibility band(s), a sampling number, or sampling count, can be determined. The filtered contour PMR bands provide more reliable data on which to determine the sample number because the unphysical excursions and other sources of noise are filtered out.

Processing proceeds to step S285, where sampling number mod 385 determines a sampling number for each contour identified in step S260. The sampling number is tailored to the specified contour according to the corresponding PMR(s).

Processing proceeds to step S290, where image log-slope (ILS) mod 390 computes the ILS for each gauge. Gauge placement varies by construct and construct partition. In this embodiment, weight is assigned according to PMR variation measured over a PMR band. In some embodiments, the ILS correlation to PMR variation is used to assign weights according to degree of difficulty in both metrology and modeling.

Processing proceeds to step S295, where weight function mod 395 generates weight functions for the set of contours. In this example, a relative weighting function is generated on a per-target-type basis as well as a per-slice-of-target basis. Alternatively, only one of the two relative weighting functions are generated.

Processing ends at step S298, where simulation mod 398 simulates the filtered and weighted contours. The lithography simulation is performed by a conventional simulation sub-system, or program. While processing ends in this example, processing may return to step S275, where image parameter(s) are computed.

Further embodiments of the present invention are discussed in the paragraphs that follow and later with reference to the remaining figures.

Some embodiments of the present invention provide for a method of determining an appropriate number of contours to be collected whose variability is measured by means of a PMR. A weight, based on the geometrical and image parameter description, is associated with each section, or slice, in the shape, or contour, to be considered for calibration. Further, the number of repeats are established, based on the total variability in PMR measurement for satisfactorily categorizing the selected pattern in terms of metrology difficulty, that is, in terms of the variability in measurement of the same geometry multiple times. In that way, a correlation is established between the appropriate number of contours and the difficulty in printing the selected pattern.

Figure 4:
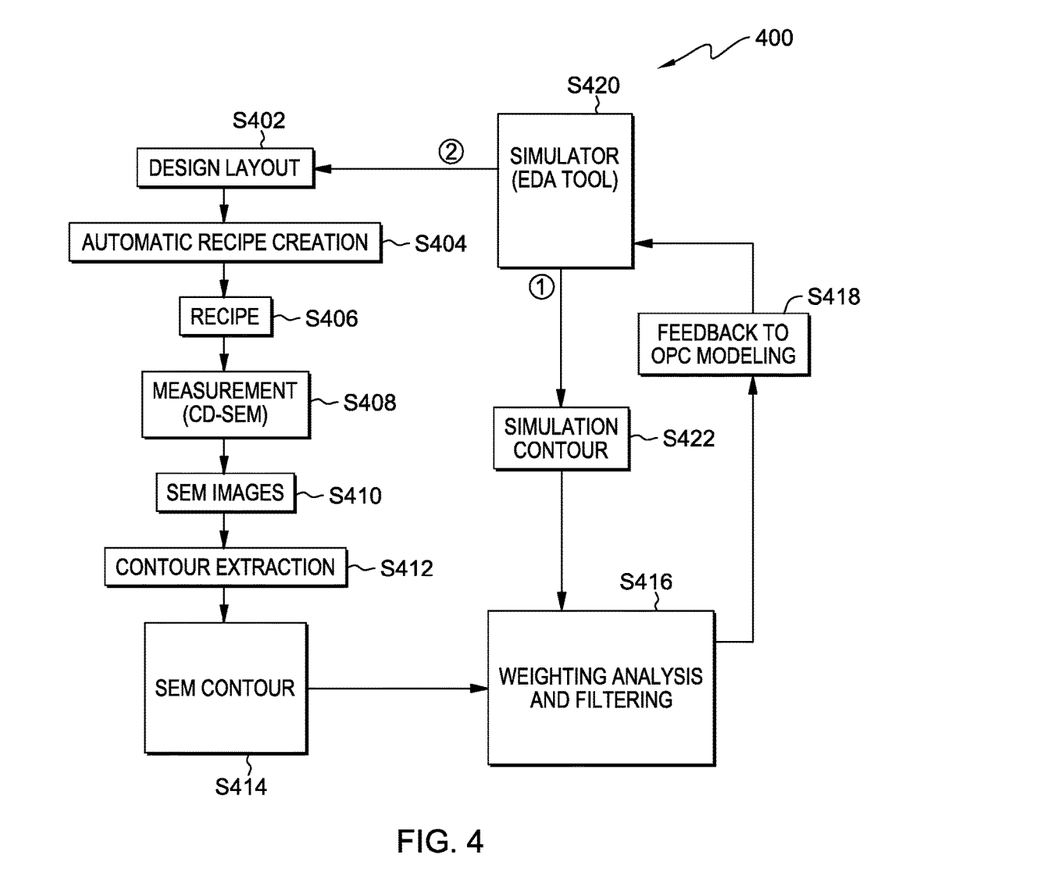
FIG. 4 is a flowchart view of a second embodiment of a method according to the present invention.

FIG. 4 shows a flowchart for contour-based design process 400. The contour-based design process follows conventional steps including: design layout S402, automatic recipe creation S404, implementing the recipe S406, measurement using critical dimension (CD) characteristics with a SEM S408, capturing SEM images of the photomask S410, and contour extraction S412.

Some embodiments of the present invention use information from the process-metrology reproducibility (PMR) band to select contours in lieu of numerous measurements required conventionally. This includes generating the PMR band as well as cleaning and sorting the data.

Processing the set of SEM contours extracted in step S412 begins at step S414, where the average SEM contour is determined with respect to a particular target contour from the set of SEM contours. Step S414 also determines a PMR band for each construct type.

Some embodiments of the present invention merge individual metrology datasets into one metrology dataset, where the individual dataset names are carried over to layer names for individual contour layers. In that way, a process-metrology reproducibility (PMR) band is generated, and the PMR band is output along with the average contours as layers for use in contour analysis.

The average SEM contour is processed at step S416, where filtering and weighting analysis are performed. The filtering process involves removing any unphysical excursions from the dataset used in determining the average contour. The weighting process, as discussed herein, includes generating cutline and determining the ILS for each corresponding construct. Variance input used in weighting includes PMR variation gauges, where the weight is decreased for increased PMR variation. The weight function is generated to account for whether the construct, or contour, is two-dimensional or one-dimensional.

The filtering and weighting analysis step is discussed in more detail below. To summarize, the output from step S416 is an estimate, for each SEM contour, for the number of samples needed for the desired precision and an estimate of the PMR band at a practical number of sampling points. Processing, according to process 400 proceeds to step S418, where the output from step S416 is input into a EDA simulator. Processing proceeds down one of two paths. The first path, 1, proceeds to step S422, where a set of simulated contours is produced. The simulated contours return to step S416 for repeated processing. The second path, 2, returns to step S402, where the refined model is used for producing a next design layout.

Some embodiments of the present invention use PMR classification to determine a weighting of selected contours and/or corresponding slices. Additionally, the PMR supports estimation of the number of repeat measurements to make for a given contour. The number of repeat measurements refers to the number of times the same geometry should be measured in order to confidently use the measurement(s) in a model calibration suite. By checking the distribution spread of the PMR band when each geometrical construct is measured, for example, 8, 7, 6, 5, and 4 times, a saturation point is established. The saturation point refers to the point where the least number of measurements of a characteristic are made to capture the maximum variability of that characteristic. That is to say, if the number of measurements is decreased below the saturation point, variability of the characteristic will be poorly captured. For some constructs, a high number of measurements, referred to herein as "repeat measurements," are required.

Some embodiments of the present invention are directed to 2D contour sampling according to target type. Target types include: (i) ends; (ii) sides; (iii) side spacing; (iv) side width; (v) end to side; (vi) L-shape (concave corner); (vii) T-shape; (viii) H-shape; (ix) isolated holes (e.g., square-shape); and/or (x) elongated holes (e.g. short bar). Additionally, partial geometry may represent a target type that can be marked and measured according to some embodiments of the present invention. An example process for 2D contour sampling by target type includes: (i) place sites based on fragmentation from simple model form; (ii) sort by construct type (pattern match); (iii) generate gauges; (iv) compute image parameters per gauge; (v) correlate image parameters and PMR, for example, 1/ILS vs. PMR variability; (vi) need plot here; (vii) determine sampling number per target by PMR estimation; and (viii) increase sampling with PMR variation.

Some embodiments of the present invention are directed to 2D SEM (scanning electron microscopy) contour filtering and metrology (metro) variability. In this example, individual SEM metro datasets are merged into one metro dataset. The merged datasets carry individual dataset names to the layer names for each individual contour layer. The example process then generates a SEM "MetroB and." The SEM metroband is a range of values for a given metrology for a given construct type. In this example, the metrics for filtering are determined, and any unphysical excursion from average contour is filtered out. An example formula for determining an appropriate unphysical excursion, E, follows:

$$E = \frac{\left(\begin{array}{c}\text{MAXIMUM CONTOUR VALUE} - \\ \text{MINIMUM CONTOUR VALUE}\end{array}\right)}{\text{AVERAGE CONTOUR VALUE}},$$

where: maximum contour value is measured from outside to outside of the PMR band; and minimum contour value is measured inside to inside of the PMR band (the minimum expected measurement for the shape, or contour geometry; and average contour value is a measurement taking into account each metrology contour collected and used to measure variability.

Having filtered out selected unphysical excursions, variance input is taken into account for weighting. It should be noted that some embodiments of the present invention predict failure mechanisms such as a short, or an open, condition based on the amount of deviation outside and/or inside from the PMR band. Variance input includes binned PMR variation gauges. The weighting is adjusted downward as PMR variation increases.

Some embodiments of the present invention take the following steps associated with variance analysis to filter out noise in contours and/or to apply weighting to a contour target: (i) merge individual metrology contours for a given target contour to generate a PMR band for the contour; (ii) clean noise from merged contours; (iii) place gauge markers on uniformly centered geometry of the merged contours; (iv) determine a PMR variance from a PMR average with reference to the maximum and the minimum contour values of the merged and cleaned contours; (v) bin the remaining merged contours as a function of deviation from the PMR average (for the merged contours) and across PMR target values to be used in determining the number of contours needed to estimate the number of repeat measurements for the contour target; and (vi) simulate gauged contours and analyze comparative performance. The simulated gauged contours may be used in determining a contour weighting strategy. A formula relating the PMR band to the number of SEM contours follows:

$$\frac{1}{\sqrt{n}} = PMR \text{ Band},$$

where, n=number of SEM contours.

Some embodiments of the present invention rely on a correlation between the PMR band and 1/ILS. This correlation provides insight into the relationship between contours that are difficult to simulate and metrology noise from the contour-forming algorithm. This correlation is based on the ability to clean the PMR of noise coming from the contour forming algorithm, such as long acute angles, and the ability to remove incomplete, or bad, PMRs for constructs for which there is a good alternative PMR.

Based on the PMR band and ILS estimation, some embodiments of the present invention provide one, or both of: (i) an estimate of the number of sampling points needed for the desired level of precision; and/or (ii) an estimate of the PMR band given a practical number of sampling points.

Some embodiments of the present invention are directed to a methodology for using contours collected by metrology tools, as discussed herein, for data filtering by selecting a minimized set of data points, for both 1D and 2D design space, for model calibration along with establishing an adequate weighting scheme for model performance.

Some embodiments of the present invention are directed to a methodology for using contours collected by metrology tools, as discussed herein, for modeling lithographic photomask with a reduced data set when compared to conventional large data sets. An example methodology includes generating a process-metrology reproducibility (PMR) band in shape representation and employing methods described herein to: (i) filter out noisy contours; (ii) to derive a guiding algorithm of sites to be measured for each pattern function of variability; and (iii) to derive a weighting algorithm for various construct types.

Figure 5:
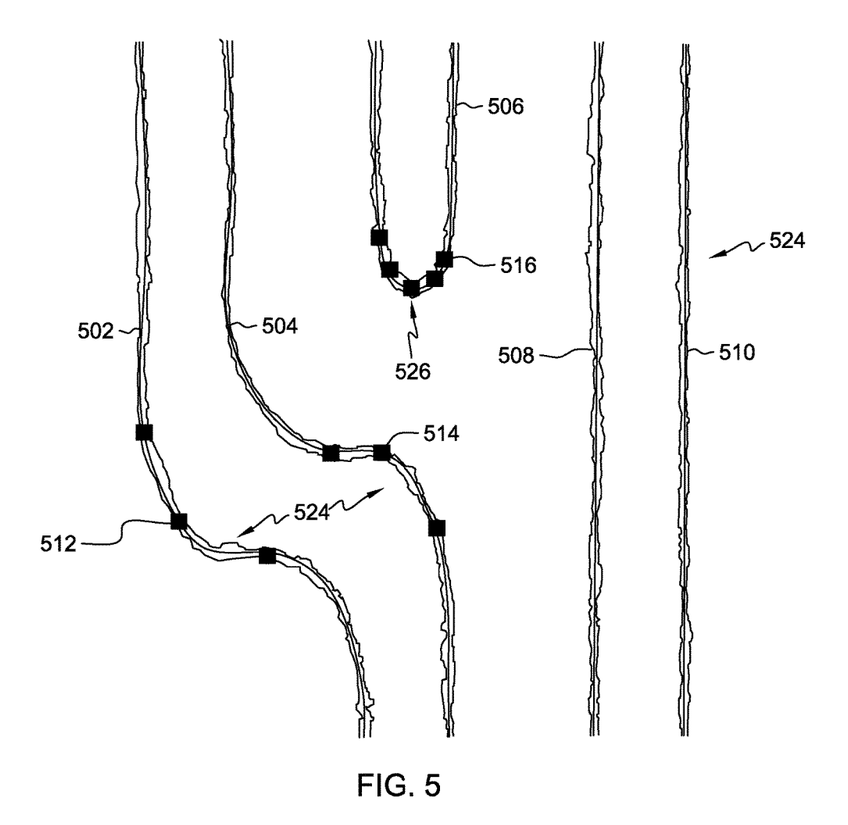
FIG. 5 is a diagram view showing information that is generated by and/or helpful in understanding embodiments of the present invention.

Some embodiments of the present invention "clean" the PMRs with placement of measurement markers. Both measurements and coordinates for all gauges are saved in a format suitable for processing, such as a spreadsheet. FIG. 5 is a graphic view of SEM contours 502, 504, 506, 508, and 510. Measurement markers 512, 514, and 516 are placed according to area type, 2D or 1D. A dense fragmentation setting is used for 2D area 526, while a lose fragmentation setting is used for 1D (relatively long) lines 524.

Figure 6:
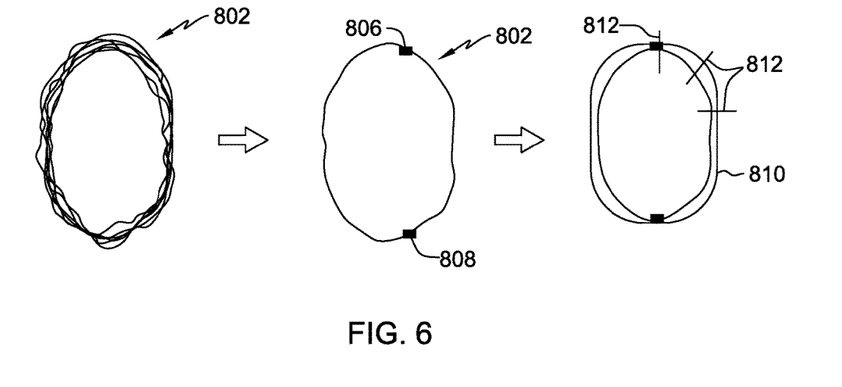
FIG. 6 is a flowchart view of a third embodiment of a method according to the present invention.

FIG. 6 is an illustration of process 800 according to an embodiment of the present invention. Process 800 begins with SEM contours set 802, where six repeat measurements are taken. Average contour 804 is generated based on the average SEM contour at markers 806 and 808 placed on sites determined by fragmentation strategy. Simulated contour 810 is the simulation of the same contour represented by six repeat measurements, contour set 802. Cut lines 812 indicate the placement of gauges for determining ΔPV Band, discussed in more detail below with respect to FIG. 7.

Some embodiments of the present invention are directed to 2D contour weighting by target contour type, or contour slice type. The target contour type is based on a set of patterns that identify the contours for a particular chip model. In this example, a 2D contour weighting starts by placing sites based on fragmentation from a simple model form. The sites are sorted by construct type by pattern matching. Gauges are generated according to the construct types identified during the sort process. With the gauges generated, the method to increase sampling according to contour slice is practiced. In this method, the image log-slope (ILS) is computed for each gauge that is generated. A relative target weighting function is computed per target type and a slice relative slice weighting function is computed per contour slice type. Some embodiments of the present invention perform the optional process where an OPC is performed according to each weighted contour slice type. Finally, variations for contour slice type, or target contour type, are analyzed.

Figure 7:
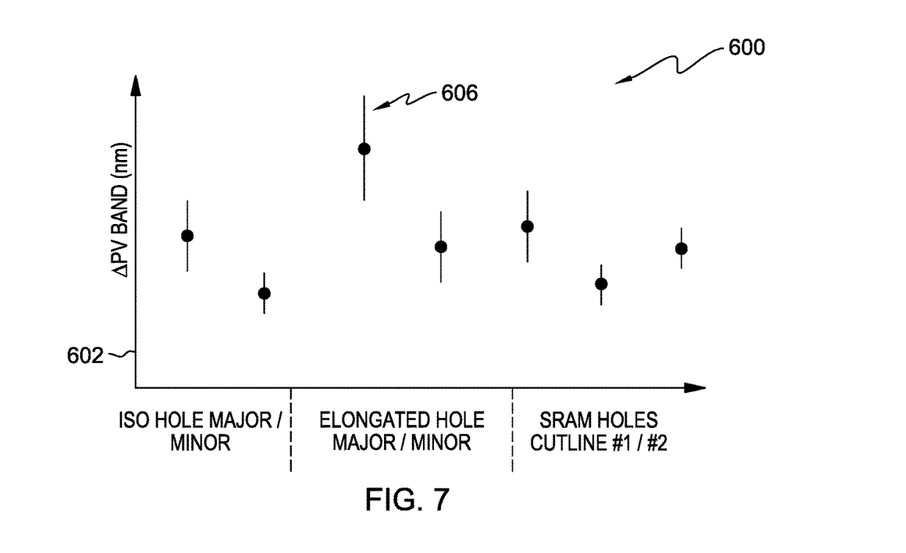
FIG. 7 is a graph view showing information that is generated by and/or helpful in understanding embodiments of the present invention.

FIG. 7 shows chart 600 that presents contour data collected by some embodiments of the present invention. Geometric construct 606, for an elongated hole, as shown on the chart has the highest metrology spread, or range, as well as the highest delta to simulation (i.e., y-axis value). This indicates that geometric construct 606 is both poorly modeled and poorly predicted. According to this classification, a lower weight is applied to geometric construct 606 relative to other constructs depicted in chart 600. Vertical axis 602 is ΔPV Band in nanometers (nm), which is the change in PV band shown in the following equation:

$$\Delta PV \text{ Band} = SEM \text{ } PV \text{ Band} - Simulated \text{ } PV \text{ Band},$$

where PV band is the process variability band, as measured over a range of simulation contours, for a range of focus and dose variation. Alternatively, the vertical axis is the normalized ΔPVband:

$$\text{Normalized } \Delta PV \text{ band} = \frac{\Delta PV \text{ Band}}{Simulated \text{ } PV \text{ Band}},$$

Horizontal axis 604 is the pattern category corresponding with the ΔPV Band value. Pattern categories include: (i) major isometric hole; (ii) minor isometric hole; (iii) major elongated hole; (iv) minor elongated hole; (v) SRAM hole for cutline #1; and (vi) SRAM hole for cutline #2. Alternatively, the horizontal axis is the cutline category (1D/2D-like edge), or the ILS value at each cutline.

Some embodiments of the present invention are directed to a weighting method where different weights are applied to different bins of PMR width. Hybrid models are built using PMR weighting techniques described herein. Measurement markers are converted to gauge cut lines to generate image parameters, such as ILS or image contrast. Alternatively, establish ILS correlation at a given site and use the correlation in determining weights for sites with the highest weight applied to the least noisy PMR.

Some embodiments of the present invention are directed to a method for sampling contours to determine deviations from the average contour through the use of multiple cut lines in areas of high frequency, which are generally harder to measure and to model.

Some embodiments of the present invention are directed to a method to substitute a manageable number of contours for multiple gauges using a randomization technique.

Some embodiments of the present invention are directed to a method to improve photomask model accuracy by using extra information from contours and application of a weighting scheme that accounts for 2D constructs more accurately than with conventional methods.

Some embodiments of the present invention are directed to method to validate photoresist compact model, CM1, to aerial image (AI) differences as a valuable metric in determining model accuracy. The photoresist compact model is calibrated based on SEM gauges and SEM contours. It is used to generate photomask shapes that transfer the design to silicon.

Some embodiments of the present invention are directed to a method to improve deterministically a sampling function of metrology variance for the same geometrical construct. Some embodiments of the present invention divide sites into the following groups: (i) sites for end widths; and (ii) sites for sides: a) space, and b) width. Some embodiments of the present invention classify PMRs according to whether the contours are clean or ill-formed. The ill-formed contours are excluded, or filtered out.

Figure 8A:
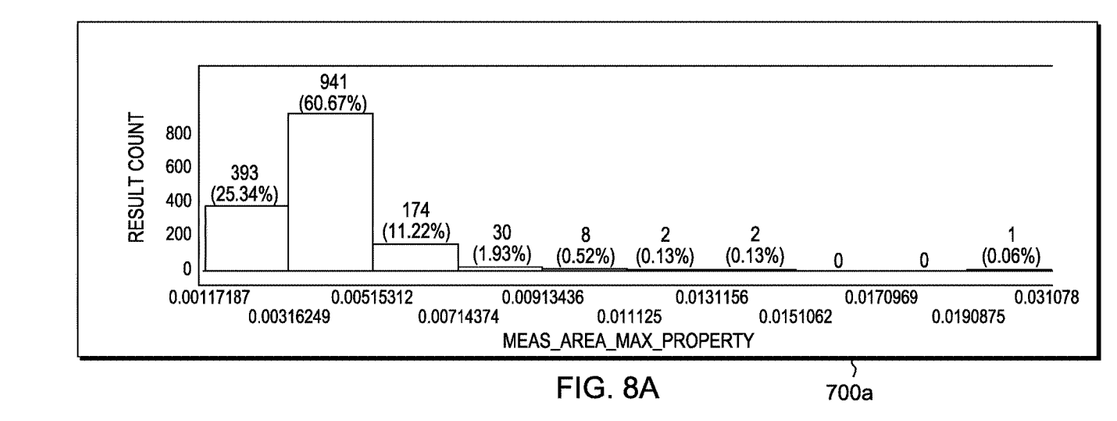
FIGS. 8A and 8B are screenshots showing information that is generated by and/or helpful in understanding embodiments of the present invention.
Figure 8B:
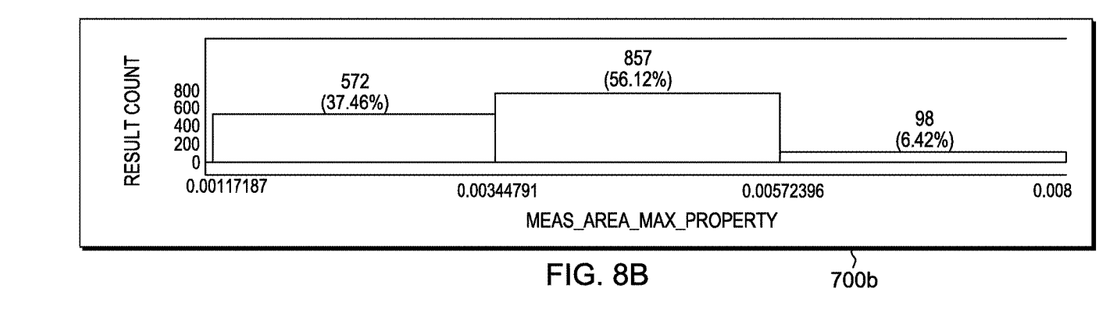

FIG. 8A shows screenshot 700a with a measured PMR distribution before weighting analysis and filtering. FIG. 8B shows screenshot 700b with a measured PMR distribution after filtering out ill-formed contours.

Some embodiments of the present invention are directed to a weighting strategy for difficult to create constructs in establishing a verification model. In this example, higher weights are assigned to difficult constructs. Difficult constructs are defined by the following: (i) large variance in PMR band; and (ii) large change in metrology from simulation with a previous verification model. Assigning a higher weight to these difficult constructs improves model training to predict printability failure of a given construct. While a model incorporating the described weighting scheme cannot safely be used in OPC, the weighting scheme can successfully be used to build a verification model.

Some embodiments of the present invention may include one, or more, of the following features, characteristics and/or advantages: (i) a method to filter and remove poor metrology before is sent to the modeler; (ii) a method to decide on metrology quality and determine number of measurements needed for each construct; (iii) a methodology for sampling and pattern selection for model calibration data using SEM contours; (iv) a method to improve model accuracy based on a weighting strategy derived from the PMR band (metrology variability) and relation to aerial image (AI) contrast derived from image log slope calculation; (v) employs SEM contours in model calibration; (vi) feeds metrology contours directly to model calibration; (vii) establishes correlations between metrology variations, as captured in the PMR concept; (viii) applies a weighting factor attributed to different geometric entity; and/or (ix) builds a model for OPC and verification using contours collected by metrology tools.

Some helpful definitions follow:

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

User/subscriber: includes, but is not necessarily limited to, the following: (i) a single individual human; (ii) an artificial intelligence entity with sufficient intelligence to act as a user or subscriber; and/or (iii) a group of related users or subscribers.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

What is claimed is:

1. A method comprising:
   determining an average contour based on a filtered subset of a plurality of scanning electron microscopy (SEM) metrology datasets corresponding to a target contour;
   computing an image parameter for a set of gauges for the target contour;
   correlating the image parameter and a process-metrology reproducibility (PMR) band to generate a parameter to PMR band correlation;
   determining a sampling count for the target contour based at least in part on the parameter to PMR band correlation;
   computing an image log-scope (ILS) value for each gauge in the set of gauges;
   generating a weight function for the target contour based at least in part on a PMR variance and the ILS value;
   creating a lithography simulation model based on the weight function;
   calibrating a photoresist compact model according to the lithography simulation model;
   generating photomask shapes with the photoresist compact model; and
   creating an integrated circuit based on the photomask shapes;
   wherein:
   the filtered subset excludes unphysical excursions of the target contour.

2. The method of claim 1, further comprising:
   assigning an increased relative weight for a selected contour;
   wherein the selected contour is selected from a set of target contours based on specified outer limits of the PMR band and the parameter to PMR band correlation.

3. The method of claim 1, further comprising:
   extracting the target contour from a set of SEM images.

4. The method of claim 1, further comprising:
   identifying, based on a fragmentation setting, the set of gauges for the target contour.

5. The method of claim 1, wherein:
   the step of correlating the image parameter and a PMR band includes placing a set of measurement markers according to one of a first fragmentation setting where markers are placed for a two-dimensional target contour, and a second fragmentation setting where markers are placed for a one-dimensional target contour; and
   the first fragmentation setting applies a more dense set of markers than the second fragmentation setting.

6. A computer program product comprising a computer readable storage medium having program instructions embodied therewith, the program instructions readable by a computer to cause the computer to:
   determine an average contour based on a filtered subset of a plurality of scanning electron microscopy (SEM) metrology datasets corresponding to a target contour;
   compute an image parameter for a set of gauges for the target contour;
   correlate the image parameter and a process-metrology reproducibility (PMR) band to generate a parameter to PMR band correlation;
   determine a sampling count for the target contour based at least in part on the parameter to PMR band correlation;
   compute an image log-scope (ILS) value for each gauge in the set of gauges;
   generate a weight function for the target contour based at least in part on a PMR variance and the ILS value;
   create a lithography simulation model based on the weight function;
   calibrate a photoresist compact model according to the lithography simulation model;
   generate photomask shapes with the photoresist compact model; and
   create an integrated circuit based on the photomask shapes;
   wherein:
   the filtered subset excludes unphysical excursions of the target contour.

7. The computer program product of claim 6, further comprising:
   program instructions readable by a computer to cause the computer to assign an increased relative weight for a selected contour;
   wherein:
   the selected contour is selected from a set of target contours based on specified outer limits of the PMR band and the parameter to PMR band correlation.

8. The computer program product of claim 6, further comprising:
   program instructions readable by a computer to cause the computer to extract the target contour from a set of SEM images.

9. The computer program product of claim 6, further comprising:
   program instructions readable by a computer to cause the computer to identify the set of gauges for the target contour.

10. The computer program product of claim 6, wherein:
    the program instructions readable by a computer to cause the computer to correlate the image parameter and the PMR band includes causing the computer to place a set of measurement markers according to one of a first fragmentation setting where markers are placed for a two-dimensional target contour and a second fragmentation setting where markers are placed for a one-dimensional target contour; and
    the first fragmentation setting applies a more dense set of markers than the second fragmentation setting.

11. A computer system comprising:
    a processor set; and
    a computer readable storage medium;
    wherein:

the processor set is structured, located, connected, and/or programmed to run program instructions stored on the computer readable storage medium; and the program instructions include:
- a first set of program instructions programmed to determine an average contour based on a filtered subset of a plurality of scanning electron microscopy (SEM) metrology datasets corresponding to a target contour;
- a second set of program instructions programmed to compute an image parameter for a set of gauges for the target contour;
- a third set of program instructions programmed to correlate the image parameter and a process-metrology reproducibility (PMR) band to generate a parameter to PMR band correlation;
- a fourth set of program instructions programmed to determine a sampling count for the target contour based at least in part on the parameter to PMR band correlation;
- a fifth set of program instructions programmed to compute an image log-scope (ILS) value for each gauge in the set of gauges;
- a sixth set of program instructions programmed to generate a weight function for the target contour based at least in part on a PMR variance and the ILS value;
- a seventh set of program instructions programmed to create a lithography simulation model based on the weight function; and
- an eighth set of program instructions programmed to calibrate a photoresist compact model according to the lithography simulation model;
- a ninth set of program instructions programmed to generate photomask shapes with the photoresist compact model; and
- a tenth set of program instructions programmed to create an integrated circuit based on the photomask shapes;

wherein:
the filtered subset excludes unphysical excursions of the target contour.

12. The computer system of claim 11, further comprising:
an eleventh set of program instructions programmed to assign an increased relative weight for a selected contour;
wherein:
the selected contour is selected from a set of target contours based on specified outer limits of the PMR band and the parameter to PMR band correlation.

13. The computer system of claim 11, further comprising:
an eleventh set of program instructions programmed to extract the target contour from a set of SEM images.

14. The computer system of claim 11, further comprising:
an eleventh set of program instructions programmed to identify the set of gauges for the target contour.

15. The computer system of claim 11, wherein:
the third set of program instructions programmed to correlate the image parameter and the PMR band to includes causing the computer to place a set of measurement markers according to one of a first fragmentation setting where markers are placed for a two-dimensional target contour and a second fragmentation setting where markers are placed for a one-dimensional target contour; and
the first fragmentation setting applies a more dense set of markers than the second fragmentation setting.

* * * * *